(12) United States Patent
Lai et al.

(10) Patent No.: US 9,507,894 B1
(45) Date of Patent: Nov. 29, 2016

(54) AUTOMATIC HARMONIC NUMBER IDENTIFICATION FOR HARMONIC BALANCE ANALYSIS

(71) Applicant: CADENCE DESIGN SYSTEMS, INC., San Jose, CA (US)

(72) Inventors: Xiaolue Lai, San Jose, CA (US); Xiaohui Wang, Beijing (CN)

(73) Assignee: Cadence Design Systems, Inc., San Jose, CA (US)

( * ) Notice: Subject to any disclaimer, the term of this patent is extended or adjusted under 35 U.S.C. 154(b) by 648 days.

(21) Appl. No.: 13/630,471

(22) Filed: Sep. 28, 2012

(51) Int. Cl.
*G06F 17/50* (2006.01)
*G06F 17/14* (2006.01)

(52) U.S. Cl.
CPC ....... *G06F 17/5022* (2013.01); *G06F 17/5036* (2013.01); *G06F 17/14* (2013.01); *G06F 17/141* (2013.01); *G06F 17/142* (2013.01)

(58) Field of Classification Search
CPC .. G06F 17/5036; G06F 17/14; G06F 17/141; G06F 17/142
USPC .......................................................... 703/14
See application file for complete search history.

(56) References Cited

PUBLICATIONS

Zhu et al., Adaptive Harmonic Balance Analysis of Oscillators Using Multiple Time Scales, IEEE, 2005.*
EELE445-14 Lecture 3,4, Power, Energy, Time average operator section 2.1, Montana State University, Jan. 2014.*
"ECED 3511 Assignment 1: Solutions" http://umdcc.ece.dal.ca/ECED3501/downloads/ECED3511_2013Assign1_Sol.pdf, Jun. 2013.*
Nyack, "Fourier Series and Signal Power" http://cnyack.homestead.com/files/afourse/fsen.htm, Aug. 2007.*
"APA 4311; Laboratory No. 1; Frequency Analysis of Signals" http://www.health.uottawa.ca/biomech/courses/apa4311/lab1.pdf, Sep. 2008.*
Zhu, Lei Lana, and Carlos E. Christoffersen. "Fast transient analysis of oscillators using multiple time scales with accurate initial conditions." In Electrical and Computer Engineering, 2005. Canadian Conference on, pp. 718-721. IEEE, 2005.*

* cited by examiner

*Primary Examiner* — Aniss Chad
(74) *Attorney, Agent, or Firm* — Andrews Kurth Kenyon LLP

(57) ABSTRACT

An apparatus and method for identifying an optimal harmonic number of a circuit are disclosed. In a simulation of the circuit, a periodic input waveform up to a particular number of periods is applied to the modeled circuit and an output waveform is obtained in response. In response to detection of a steady state response of the output waveform, embodiments simulate the circuit by applying an additional period of the periodic input waveform and obtaining the output waveform corresponding to the additional period of the periodic input waveform. A time domain power value and a frequency domain power value are calculated using the output waveform corresponding to the additional period of the periodic input waveform. Embodiments detect a harmonic of the output waveform corresponding to the additional period of the periodic input waveform at which the time domain power value and the frequency domain power value converge with each other.

27 Claims, 8 Drawing Sheets

AUTOMATIC HARMONIC NUMBER IDENTIFICATION FOR HARMONIC BALANCE ANALYSIS

BACKGROUND

The present invention relates to the field of simulations. More particularly, the present invention relates to harmonic balance simulations.

Simulations are used to model physical devices to facilitate device design, prototyping, and/or testing. A computer system typically runs simulations by executing a set of instructions or code representative of devices and the functionalities/interactions that occur between these devices. A modeled device may comprise a component on an integrated chip (e.g., a resistor, transistor, processor, bus, clock memory, etc.), the entire integrated circuit (I C), a system including an IC, or other components of an electronic system.

Once a model representative of a device has been generated, various properties of the device, including its interaction with other modeled device(s), can be analyzed within the simulation environment. The collection of one or more modeled devices (also referred to as a modeled system) is analyzed by subjecting it to various known inputs and studying the outputs. Given the complexity of devices represented by the modeled system, a number of different analyses are typically performed to fully understand device properties and behaviors.

One of the analyses performed on modeled systems is harmonic balance analysis. Harmonic balance analysis comprises a frequency domain analysis technique to obtain the steady state response of a modeled system. A known periodic excitation or signal is provided as the input to the modeled system, such as a radio frequency (RF) or microwave circuit. In response, the modeled system output varies as a function of time—initially, the output is a transient response and then after a long time period, the output stabilizes and becomes periodic. Since the response of interest is the periodic or steady state portion of the output, knowing the point at which the response switches from transient to steady state would be useful. Once the modeled system response has switched from transient to steady state, all harmonics of the steady state response need not be modeled to obtain an accurate steady state response of the modeled system. Instead, merely a certain number of harmonics of the steady state response may be simulated, such simulation result representing an accurate steady state response of the modeled system. The minimum number of harmonics that should be simulated to obtain an accurate steady state response is referred to as an optimal harmonic number for the modeled system.

Currently, when harmonic balance analysis is to be performed on a modeled system, its optimal harmonic number is not known. A user requesting the simulation (e.g., a circuit designer) typically takes a guess and enters the guessed optimal harmonic number as the harmonic number setting. However, if the entered harmonic number is too small, the simulation result suffers from aliasing error, inaccuracy, and/or lack of convergence. Conversely if the entered harmonic number is too large, the simulation takes a long time and/or the simulation may run out of memory before it completes. Moreover, it may not be obvious from the simulation results that an inappropriate harmonic number was used for the harmonic balance analysis simulation.

Thus, it would be beneficial to automatically determine an optimal harmonic number for a circuit to be modeled. It would be further beneficial for the determined harmonic number to facilitate efficient and accurate harmonic balance analysis simulation of the circuit. It would also be beneficial for automatic determination of the optimal harmonic number to occur quickly, especially relative to the harmonic balance analysis simulation time.

BRIEF SUMMARY

An apparatus and method for identifying an optimal harmonic number of a circuit are disclosed herein. In a simulation of the circuit, a periodic input waveform up to a particular number of periods is applied to the modeled circuit and an output waveform is obtained in response. In response to detection of a steady state response of the output waveform, embodiments simulate the circuit by applying an additional period of the periodic input waveform and obtaining the output waveform corresponding to the additional period of the periodic input waveform. A time domain power value and a frequency domain power value are calculated using the output waveform corresponding to the additional period of the periodic input waveform. Embodiments detect a harmonic of the output waveform corresponding to the additional period of the periodic input waveform at which the time domain power value and the frequency domain power value converge with each other. The detected harmonic comprises a number of harmonics of the steady state output waveform to be modeled during harmonic balance analysis.

Other features and aspects of the invention will become apparent from the following detailed description, taken in conjunction with the accompanying drawings which illustrate, by way of example, the features in accordance with the embodiments.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

Figure 1:
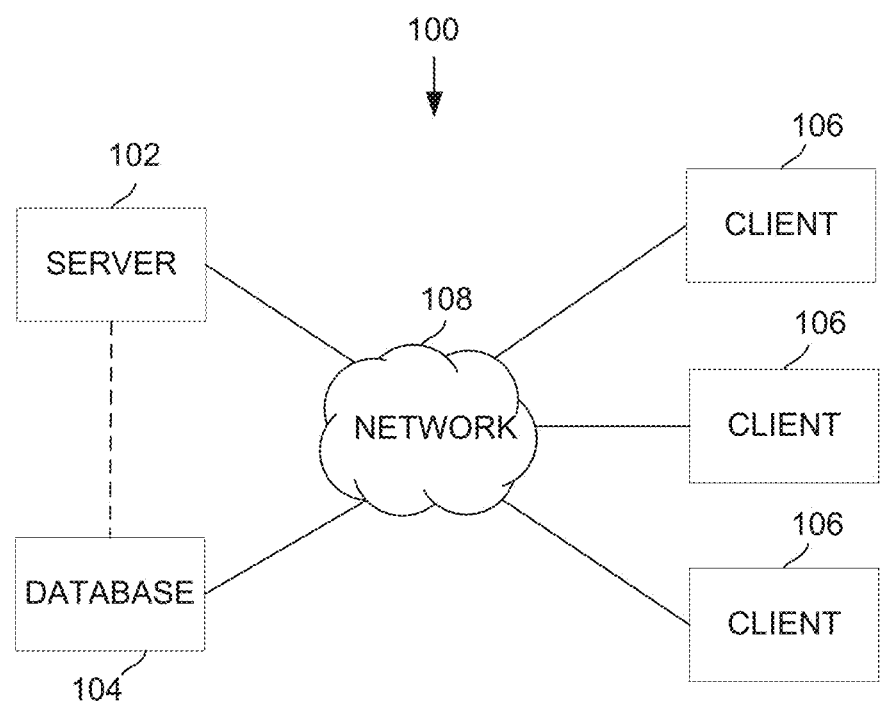
FIG. 1 illustrates an example system for automatic determination of an optimal harmonic number for use in conducting a harmonic balance analysis of a given circuit design according to some embodiments.

The headings provided herein are for convenience only and do not necessarily affect the scope or meaning of the terms used.

DETAILED DESCRIPTION

Described in detail below is an apparatus and method for determining an optimal harmonic number for use in conducting harmonic balance analysis that is computationally efficient without sacrificing accuracy of results. The optimal harmonic number comprises the minimum harmonic number of an output waveform to simulate, such output waveform comprising an accurate steady state response of a circuit being modeled in response to application of a known input periodic signal. Prior to conducting the harmonic balance analysis of a given circuit, transient simulation of the given circuit is performed in increments of up to 50 periods of a known input periodic signal. The corresponding output waveform at each node of the given circuit is checked to see whether steady state has been reached. If steady state is detected for all nodes of the circuit, then transient simulation is extended for one extra input signal period. Using the output waveform corresponding to the one extra input signal period, the time domain power value and the frequency domain power value are calculated for each node of the circuit. The time domain and frequency domain power values are compared against harmonic number criteria for detection of an optimal harmonic number.

Various modifications to the preferred embodiments will be readily apparent to those skilled in the art, and the generic principles defined herein may be applied to other embodiments and applications without departing from the scope of the invention. Moreover, in the following description, numerous details are set forth for the purpose of explanation. However, one of ordinary skill in the art will realize that the invention might be practiced without the use of these specific details. In other instances, well-known structures and processes are not shown in block diagram form in order not to obscure the description of the invention with unnecessary detail. Thus, the present invention is not intended to be limited to the embodiments shown, but is to be accorded the widest scope consistent with the principles and features disclosed herein.

Simulations are used to model physical devices to facilitate device design, prototyping, and/or testing. A computer system typically runs simulations by executing a set of instructions or code representative of devices and the functionalities/interactions that occur between these devices. A modeled device may comprise a component on an integrated chip (e.g., a resistor, transistor, processor, bus, clock memory, etc.), the entire integrated circuit (IC), a system including an IC, or other components of an electronic system. Once a model representative of a device has been generated, various behaviors of the device, including its interaction with other modeled device(s), can be analyzed within the simulation environment.

An example of electronic systems that can be modeled is circuits comprising a plurality of devices or components (e.g., resistors, transistors, and the like). In particular, microwave or radio frequency (RF) circuits, such as wireless, WiFi, or cellular IC circuits and chips, oscillators, power amplifiers and the like, may be modeled and their behavior and properties simulated within a simulation environment. In order to efficiently and accurately conduct harmonic balance analysis of the circuit design, a pre-analysis is performed to automatically determine an optimal harmonic number for use in conducting the harmonic balance analysis. Such pre-analysis and harmonic balance analysis is carried out by a computing system as shown in FIG. 1.

FIG. 1 illustrates an example system 100 for automatic determination of an optimal harmonic number for use in conducting a harmonic balance analysis of a given circuit design according to some embodiments. System 100 includes a server 102, a database 104, one or more clients 106, and a network 108. Each of server 102, database 104, and clients 106 is in communication with network 108.

Server 102 comprises one or more computers or processors configured to communicate with clients 106 via network 108. Server 102 may be located at one or more geographically distributed locations. Server 102 hosts one or more applications accessed by clients 106 and/or facilitates access to the content of database 104. Database 104 comprises one or more databases configured to communicate with server 102 and/or clients 106 via network 108. Although not shown, database 104 may also communicate with server 102 without needing network 108. Database 104 may be located at one or more geographically distributed locations from each other and also from server 102. Alternatively, database 104 may be included within server 102. Database 104 comprises a storage device for storing data and/or instructions for use by server 102 and/or clients 106.

Each of clients 106 comprises a computer or other computing device, including but not limited to, work stations, personal computers, general purpose computers, Internet appliances, hand-held devices, wireless devices, portable devices, wearable computers, cellular or mobile phones, portable digital assistants (PDAs), smart phones, multiprocessor systems, microprocessor-based or programmable consumer electronics, game consoles, set-top boxes, network PCs, mini-computers, and the like. Clients 106 include applications (e.g., web browser application such as Internet Explorer, Chrome, Firefox, Safari, etc.) or other necessary interface capabilities to communicate with server 102 and database 104 via network 108. Clients 106 may be located geographically dispersed from each other, server 102, and/or database 104. Although three clients 106 are shown in FIG. 1, more or less than three clients may be included in system 100. Device or circuit designers access the simulation environment capable of providing harmonic balance analysis via clients 106.

Network 108 comprises a communications network, such as a local area network (LAN), a wireless LAN (WLAN), a wide area network (WAN), a wireless WAN (WWAN), a metropolitan area network (MAN), an ad hoc network, an intranet, an extranet, a virtual private network (VPN), a portion of the Internet, the Internet, a portion of a public switched telephone network (PSTN), a cellular network, or a combination of two or more such networks. When network 108 comprises a public network, security features (e.g., VPN/SSL secure transport) may be included to ensure authorized access within system 100.

The simulation environment capable of providing the pre-analysis (also referred to as the automatic harmonic number determination tool or harmonic number tool) and harmonic balance analysis (also referred to as the harmonic balance analysis simulation, harmonic balance simulation, harmonic balance simulator, or harmonic balance simulation tool) may be hosted by one or more components within system 100. In one embodiment, the pre-analysis and harmonic balance analysis tools are hosted on server 102 and remotely accessed by clients 106 via network 108. In another embodiment, the tools reside locally on clients 106. Server 102 may be involved for purposes of updating and/or monitoring the functionalities performed on clients 106, and/or to facilitate interaction with database 104 by clients 106. In still another embodiment, a portion of the tools may reside at server 102 and another portion of the tools may reside at clients 106.

Alternatively, clients 106 may be standalone stations not connected to a network. In this case, database 104 (or similar functionality) may be included in clients 106 to provide information used in pre-analysis, as described in detail below. In yet another alternative, the tools may be implemented on a peer-to-peer network rather than the server-client model shown in FIG. 1.

In one embodiment, the automatic determination of a harmonic number described herein is implemented as part of a larger simulator (a simulation product or service) that is capable of running different types of simulations. For example, the simulator may be configured to perform the harmonic number determination and also the harmonic balance simulation. In another embodiment, the harmonic number determination functionalities may be implemented as a tool separate from the simulator itself. In this case, the tool includes code to model the circuit (or is otherwise able to obtain the modeling information from another source such as the simulator), input functions, and/or other information necessary to perform the optimal harmonic number calculation.

Figure 2:
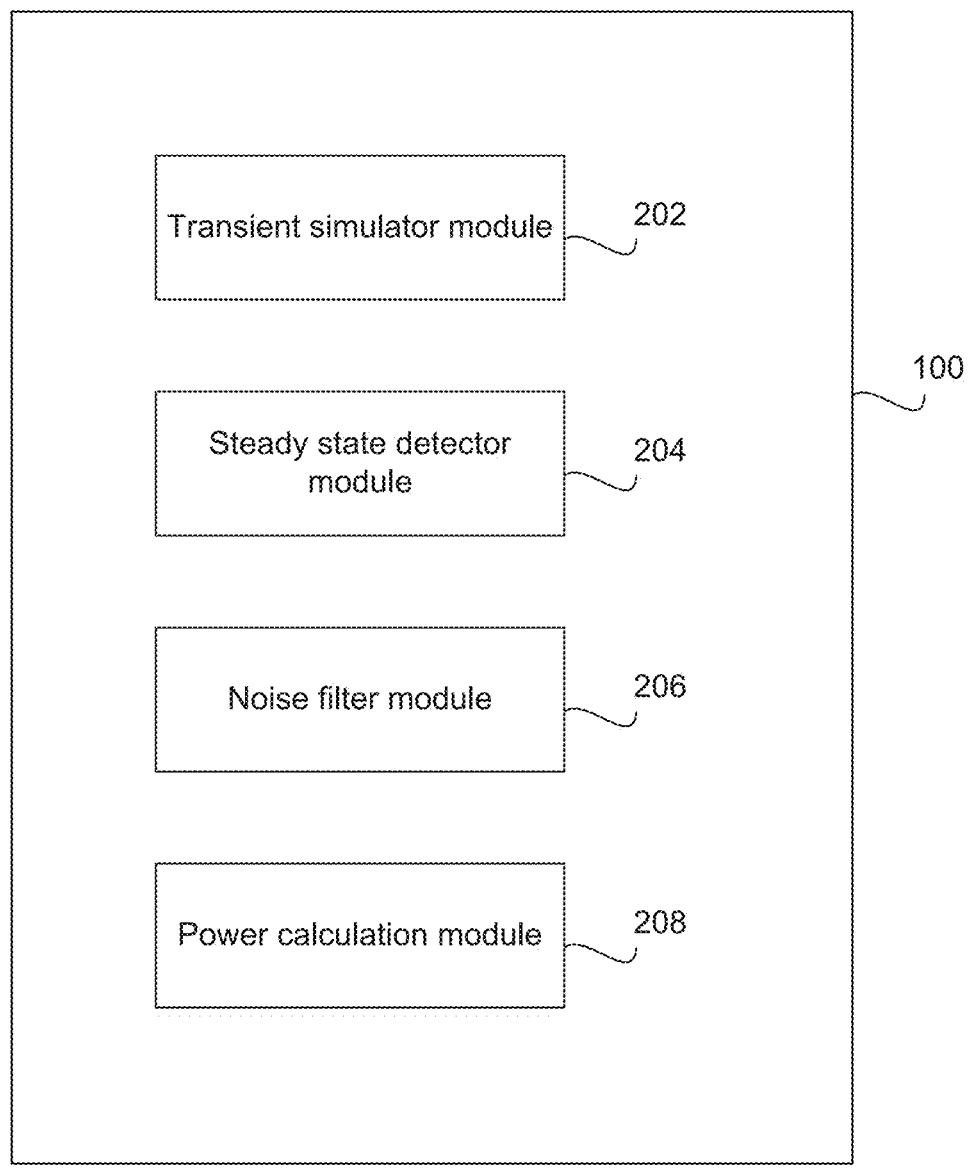
FIG. 2 illustrates a block diagram showing example modules configured to perform the process of flow diagram of FIG. 3 according to some embodiments.

FIG. 2 illustrates a block diagram showing example modules configured to perform the process of flow diagram 300 according to some embodiments. The modules of FIG. 2 comprise modules that represent configuration of a computer using instructions stored in a computer readable storage device. When the information stored in the computer readable storage device are executed by a computer system or processor, it causes one or more processors, computers, or machines to perform certain tasks as described herein. Both the computer readable storage device and the processing hardware/firmware to execute the encoded instructions stored in the storage device are components of system 100. Although the modules shown in FIG. 2 are shown as distinct modules, it should be understood that they may be implemented as fewer or more modules than illustrated. It should also be understood that any of the modules may communicate with one or more components included in system 100, such as server 102, database 104, or clients 106. Modules include a transient simulator module 202, a steady state detector module 204, a noise filter module 206, and a power calculation module 208. The modules of FIG. 2 are discussed below in conjunction with flow diagram 300.

Figure 3:
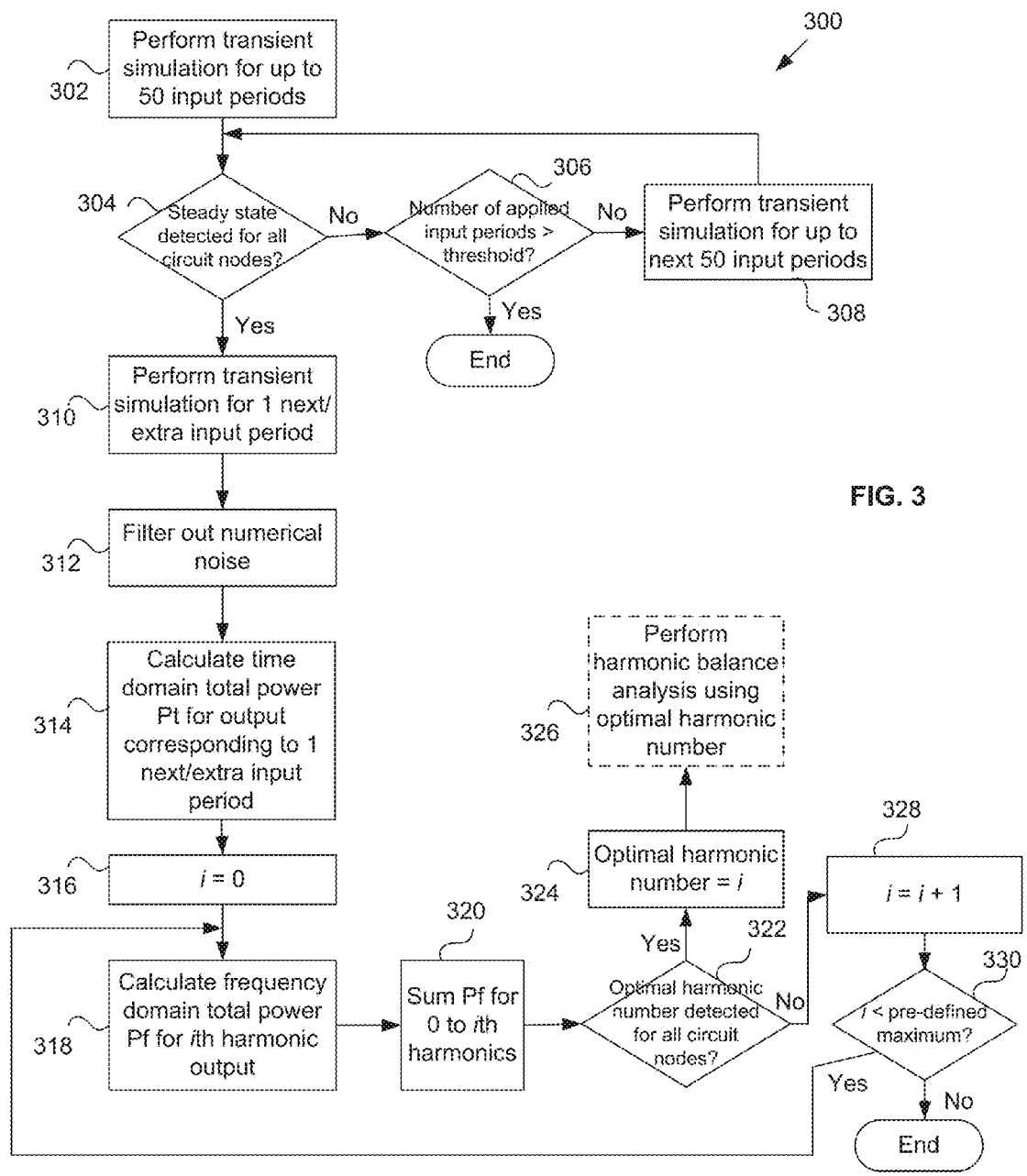
FIG. 3 illustrates an example flow diagram showing operations for automatically determining an optimal harmonic number for use in conducting an efficient and accurate harmonic balance analysis according to some embodiments.

FIG. 3 illustrates an example flow diagram 300 showing operations for automatically determining or identifying an optimal harmonic number for use in conducting an efficient and accurate harmonic balance analysis according to some embodiments. The optimal harmonic number for a circuit under consideration represents the minimum harmonic number of the circuit's output waveform at steady state to be modeled/simulated during harmonic balance analysis. Because harmonic balance analysis aims to obtain the steady state response of the circuit, modeling the circuit's steady state output waveform to the same harmonic number as the optimal harmonic number results in obtaining accurate steady state response of the circuit. The simulator can model the circuit to a higher harmonic number than the optimal harmonic number. However, this is a waste of time (simulation time is increased) and resources (more processor and/or memory required) with no increase in accuracy or additional information about the circuit's steady state response. Similarly, if the simulator models the circuit to a harmonic number that is smaller than the optimal harmonic number, the simulation result is inaccurate and/or steady state response may not be obtained. In some instances, it may not be obvious from the simulation result that it is inaccurate or contains errors. Hence, the optimal harmonic number is the minimum harmonic number of the circuit at which the modeled steady state output waveform is accurate/correct.

At a block 302, the transient simulator module 202 is configured to perform transient simulation of a model representative of the (RF) circuit under consideration when driven by a known periodic signal. The type of RF circuit may dictate the excitation signal. For example, mixers are excited by a local oscillation (LO) signal, power amplifiers are excited by a modulated carrier signal, oscillators by their own inherent oscillating signal, and the like. As another example, the known periodic signal may comprise a sinusoidal signal.

Figure 4:
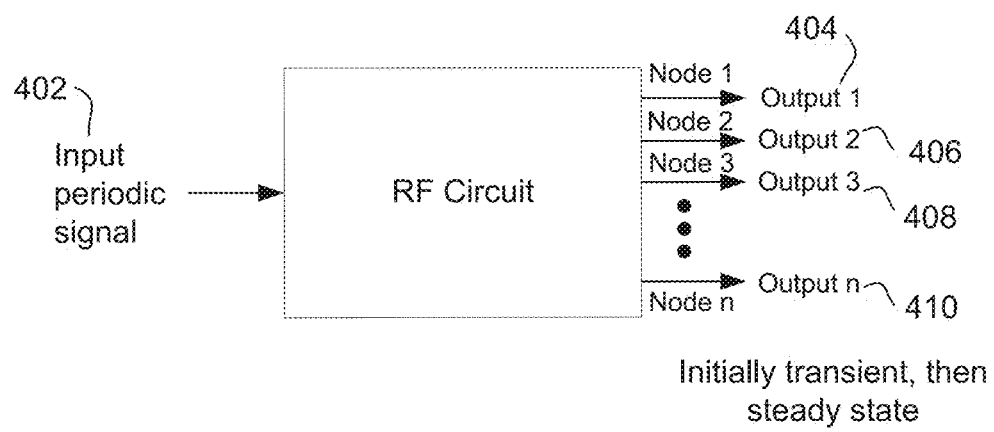
FIG. 4 illustrates an example block diagram showing an input applied to a model circuit and the model circuit's output response according to some embodiments.

In block 302, the excitation signal, also referred to as the input signal or periodic input signal, contains up to 50 periods. Thus, the transient simulator module 202 runs the simulation up to 50 input periods. Alternatively, the simulation can be run three input periods at a time—at a first time, run input periods 1, 2, and 3 to obtain respectively corresponding output signals; at a second time, run input periods 4, 5, and 6 to obtain respectively corresponding output signals, etc. As shown in FIG. 4, when a periodic input signal 402 (also referred to as a periodic input waveform) is applied to a model of a circuit under consideration, the output signal comprises a plurality of output signals or waveforms, an output signal for each voltage or current node of the circuit being modeled. FIG. 4 shows a first output signal 404 corresponding to circuit node 1, a second output signal 406 corresponding to circuit node 2, a third output signal 408 corresponding to circuit node 3, and the like up to an nth output signal 410 corresponding to the nth circuit node.

When the periodic input signal 402 is applied to the model of the circuit under consideration, each of the output signals 404, 406, 408, 410 initially exhibits transient response and then after a long time period (e.g., may be hundreds or thousands of the input signal periods), the response becomes periodic or steady state. Moreover, each of the output signals 404, 406, 408, 410 can exhibit a different response from each other at a given point in time. The output signal 404 may, for example, switch or transition to steady state response at an earlier point in time than output signal 406. A modeled circuit has switched to steady state when all nodes of the modeled circuit have switched to steady state response from initial transient response.

As an example, the input signal operates at 1 GHz, thus having a period of 1 ns. Running the transient simulation up to 50 periods of the input signal comprises running the simulation up to 50 ns of the input signal.

Next at a block 304, the steady state detector module 204 is configured to detect whether steady state response (or near steady state response) has occurred for the output signals corresponding to the applied input signal periods for all nodes of the modeled circuit. Details pertaining to detection of steady state response are discussed below in FIG. 5. In some embodiments, block 304 commences while block 302 is in progress so that if the requisite steady state response is detected prior to end of the simulation, the simulation can be terminated early.

If steady state response is not detected for even one node of the modeled circuit (no branch of block 304), then the steady state detector module 204 checks whether the total number of input periods run or applied in the simulation exceeds a pre-defined threshold period value at a block 306. As an example, the pre-defined threshold can be 500 periods of the input signal for driven-type of circuits. As another example, the pre-defined threshold can be 1000 periods of the input signal for oscillator-type of circuits. As still another example, the pre-defined threshold can be a total transient simulation time of more than 10 minutes. If the pre-defined threshold is exceeded (yes branch of block 306), then the flow diagram 300 terminates. Otherwise the pre-defined threshold has not been reached (no branch of block 306), and the transient simulator module 202 is configured to perform transient simulation for up to the next 50 input signal periods at a block 308. Then steady state response corresponding to those latest input signal periods are checked at the block 304. Similar to above, block 304 can occur simultaneously with block 308 so that simulation of the next 50 input signal periods can terminate early if steady state response is detected.

As an example, the 1st to 50th periods of the input signal are applied to the modeled circuit (block 302). Steady state has not occurred by the 50th input signal period (block 304) and the 50th input signal period is less than the pre-defined threshold period (block 306). Then additional simulation occurs by applying the 51st to 100th periods of the input signal to the modeled circuit (block 308). This loop can occur one or more times to iteratively advance to the next 50 periods of the input signal (e.g., subsequently applying the 101th to 150th periods of the input signal, then 151th to 200th periods of the input signal, etc.) until steady state response is detected for all of the circuit nodes or the total number of periods of the applied input signal exceeds the pre-defined threshold.

Once steady state is detected (yes branch of block 304), the transient simulator module 202 is configured to perform transient simulation for one extra or next period of the input signal at a block 310. This one extra/next period of the input signal is the next period following the last period at which steady state response is detected. The output signal corresponding to this one extra/next period of the input signal represents the initial harmonic balance value. At a block 312, the noise filter module 206 is configured to filter out high frequency noise, such as numerical noise or trap ringing, potentially present in the output signal for each circuit node.

Next at a block 314, the power calculation module 208 is configured to calculate the time domain total power $P_t$ for the output signal corresponding to the one extra/next period of the input signal applied at block 310. The time domain total power $P_t$ comprises the sum of the time domain power values calculated for each node's output signal corresponding to the one extra/next period of the input signal. The integral of the output signal or waveform (which is the area under the waveform) represents the time domain power value for that output signal/waveform.

At a block 316, the harmonic number index i is initially set to i=0. Next at a block 316, the power calculation module 208 is configured to calculate the frequency domain total power $P_f$ of the output signals from all of the circuit nodes corresponding to the ith harmonic. Fourier transform is applied to the ith harmonic output signals or waveforms to obtain the frequency domain total power $P_f$. The frequency domain total power $P_f$ for each of the 0th to ith harmonic are summed together at a block 320. Then at a block 322, the power calculation module 208 determines whether an optimal harmonic number is detected. Details regarding use of the frequency domain and time domain total powers to detect the optimal harmonic number are discussed below with respect to FIG. 7. At a high level, when the optimal harmonic number is reached, $P_f$ and $P_t$ are the same (or nearly the same) to each other. Thus, if $P_f/P_t>0.99$, then the optimal harmonic number for the given circuit is i. If the criteria for optimal harmonic number is satisfied (yes branch of block 322), then the optimal harmonic number for the given circuit is i (block 324). Once the optimal harmonic number is known, the system 100 can automatically use it to run harmonic balance analysis for the circuit (block 326). Alternatively, the optimal harmonic number for the circuit that has been identified may be manually entered by a user (e.g., circuit designer) into a separate harmonic balance analysis simulator.

If the optimal harmonic number criteria is not met (e.g., $P_f/P_t$ is not greater than 0.99) (no branch of block 322), then the current harmonic number is not large enough and Fourier transform is incrementally performed for the next harmonic number index and the corresponding $P_f$ and $P_t$ values are compared against the optimal harmonic number criteria. To this end, the harmonic number index i is incremented to i=i+1 (block 328). A check is performed at a block 330 to keep within a pre-defined upper limit on the harmonic number index for which Fourier transform is performed. For example, if i>501, then the flow diagram 300 ends. Otherwise the flow diagram 300 returns to block 318 to calculate the frequency domain total power $P_f$ for the next (the incremented ith) harmonic.

Thus, the smallest harmonic of the steady state output waveform corresponding to the one next/extra input period (obtained at block 310 of FIG. 3) at which the time domain total power $P_t$ and the frequency domain total power $P_f$ values converge on each other is identified. This harmonic (which has a unique harmonic number index) is the optimal harmonic number for use in conducting harmonic balance analysis of the given circuit. The output waveform corresponding to the one next/extra input period represents a portion of the output waveform that is solidly or safely in steady state. Recall that the particular input period at which the output switched from transient response to steady state response was identified in block 304.

In some embodiments, blocks 314, 318, 320, and 322 may be performed simultaneously (or almost simultaneously) with each other so that the Fourier transform calculation for incrementally successive harmonics can be terminated early as soon as the optimal harmonic number is found.

Figure 5:
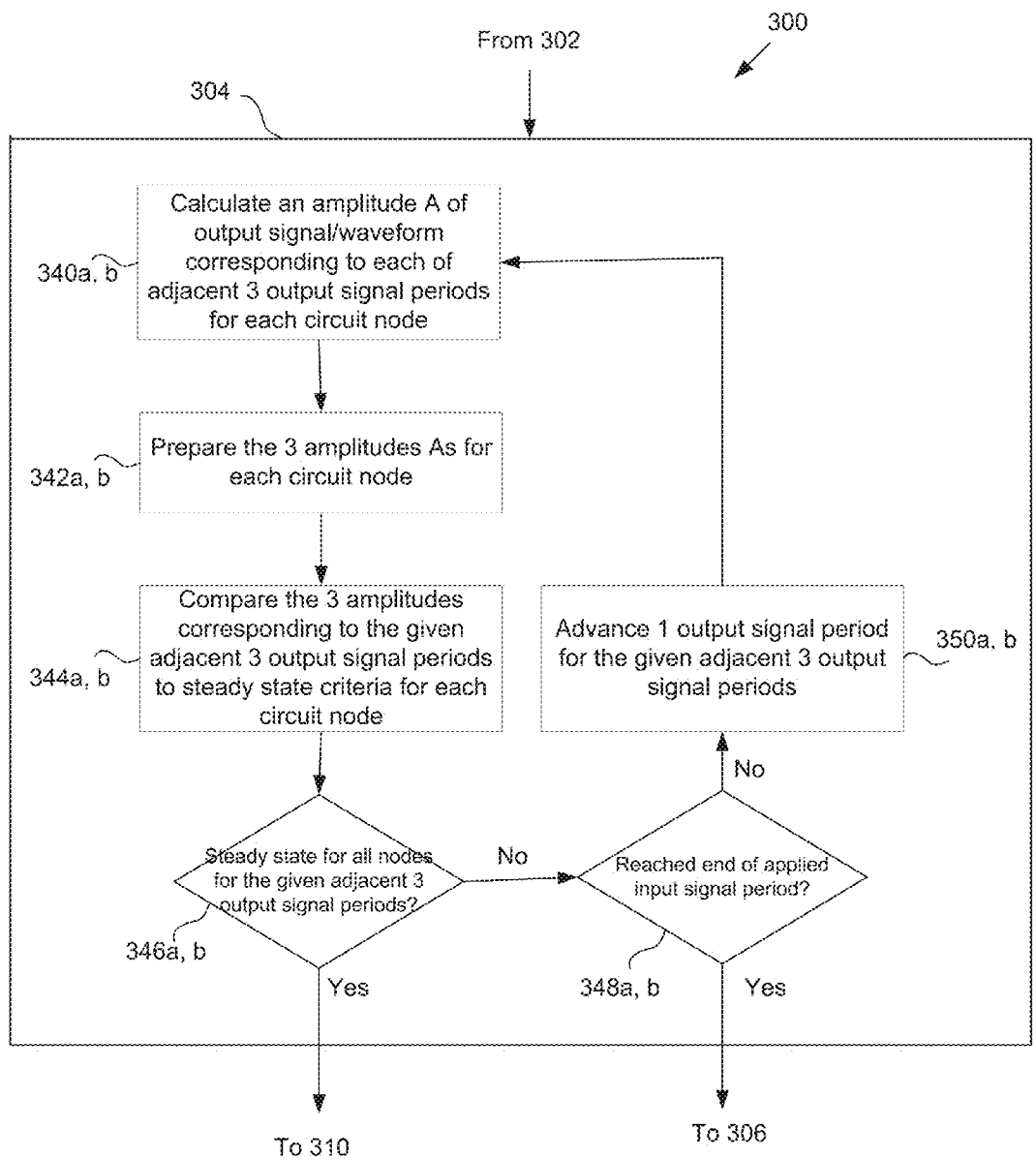
FIG. 5 illustrates example sub-blocks of FIG. 3 providing details of steady state response detection according to some embodiments.

FIG. 5 illustrates example sub-blocks of block 304 of FIG. 3 providing details of steady state response detection according to some embodiments. Circuits under consideration are either driven-type of circuits or oscillator-type of circuits. Driven-type of circuits (also referred to as driven circuits) comprise circuits for which the exact fundamental frequency or period T is known. The circuit designer provides the circuit's fundamental period T prior to commencement of flow diagram 300. By contrast, oscillator-type of circuits (also referred to as oscillator circuits) comprise circuits for which the exact fundamental frequency or period T is not known. The circuit designer provides an estimate of the circuit's fundamental period T prior to commencement of flow diagram 300. The driven circuit case is described first below followed by the oscillator circuit case.

Figure 6A:
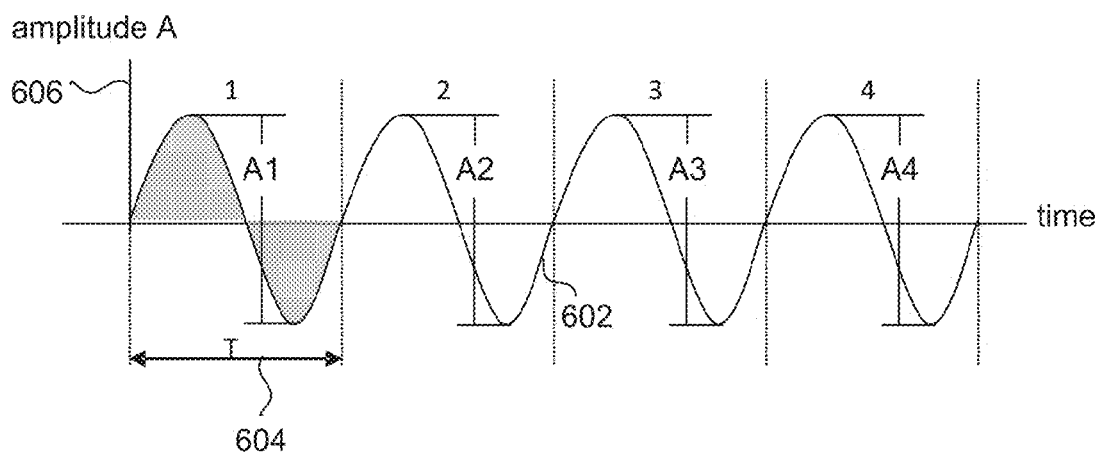
FIGS. 6A-6B illustrate example output waveforms at a given node of the modeled circuit as a function of time according to some embodiments.

For the driven circuit case, at a sub-block 340a, the steady state detector module 204 is configured to calculate an amplitude A within the fundamental period T of the output signal/waveform corresponding to each of adjacent three output signal periods for a given node of the circuit. An example waveform 602 representative of the circuit output at a given node as a function of time is shown in FIG. 6A. Note that the waveform shown in FIG. 6A is provided for illustration purposes and does not necessarily represent the actual waveform shape of the node output in response to a known periodic input signal. The waveform 602 has a fundamental period T 604 and an amplitude A 606. The waveform 602 is shown apportioned by its successive periods, with the numbers "1," "2," "3," and "4" representative of the first, second, third, and fourth successive periods of the waveform 602. Each circuit node at steady state has an output waveform having a period equal to the fundamental period T 604. Thus, once all of the circuit nodes have reached steady state, the output waveforms corresponding to all of the circuit nodes are characterized by having the same fundamental period T 604 with each other.

At the sub-block 340a, three amplitudes of waveform 602—A1, A2, and A3—are calculated or determined for each of adjacent three output signal periods 1, 2, and 3, respectively, of a given circuit node. The adjacent input signal periods may be referred to as x/y/z for shorthand, such as 1/2/3. This calculation or determination is repeated for each of the remaining nodes of the circuit under consideration. Thus, a set of three amplitudes is calculated or determined for each node of the circuit.

Next at a sub-block 342a, the steady state module 204 prepares the three amplitudes for each node to compare against the steady state criteria. In one embodiment, the maximum amplitude (max A) among all amplitudes across all nodes (for 1/2/3 periods) is identified, and if that max A>1, then reset max A=1. Also, for all nodes (for 1/2/3 periods), determine if any amplitude A<max A*reltol, where reltol is a pre-defined constant comprising a very small number.

Then at a sub-block 344a, the steady state module 204 compares the three amplitudes for a given node against the steady state criteria as follows. This is repeated from each node of the circuit, except those node(s) having an amplitude A<max A*reltol (as determined in sub-block 342a). The steady state criteria for a given node (for 1/2/3 periods) is as follows:

$$abs(d1/\text{mean}) < \text{factor}, abs(d2/\text{mean}) < \text{factor}, \text{ and } abs(d3/\text{mean}) < \text{factor}, \quad (\text{Eq. 1})$$

where factor=0.01,
d1=A1−A2,
d2=A1−A3,
d3=A2−A3, and
mean=(A1+A2+A3)/3.

The steady state criteria expressed in Eq. 1 looks for a difference of less than 1% among the set of adjacent three amplitudes to deem that steady state (or near steady state) has been reached for a given node.

If the steady state criteria is satisfied for all nodes for the given adjacent three output signal periods (yes branch of sub-block 346a), then the output of all nodes of the circuit have reached steady state and the flow proceeds to block 310. Nodes that are ignored due to their small amplitudes (amplitude<max A*reltol) are deemed to have reached steady state. Otherwise at least one node has not satisfied the steady state criteria (no branch of sub-block 346a), and a check is performed to see whether the given adjacent three output signal periods corresponds to an input signal period that is the same as the highest applied input period in the transient simulation (sub-block 348a). For example, if transient simulation has been performed for up to the 50th input signal period (at block 302 of FIG. 3) and one of the current adjacent three output signal periods corresponds to the 50th input signal period, then there are no more output signal portions to analyze for steady state. If the end or highest applied input period has been reached (yes branch of sub-block 348a), then the flow proceeds to block 306.

Otherwise there are more output signal portions to analyze (no branch of sub-block 348a), and the steady state detector module 204 advances the given adjacent three output signal periods by one period, at a sub-block 350a, and returns to sub-block 340a to analyze the next set of three amplitudes for each node. As an example, if the immediately previous periods are 1/2/3, then the next adjacent three signal periods are 2/3/4, and then the adjacent three signal periods after that are 3/4/5, etc.

For Eq. 1 of sub-block 344a, if steady state still has not occurred at all nodes as the time/output period number is increasing, the steady state criteria is loosened. In one embodiment, for time>20 periods, the pre-defined constant "factor" is loosened from 0.01 to 0.03. This means that steady state is deemed to be reached when a difference of less than 3% occurs (as opposed to the tighter criteria of less than 1%). Moreover, once time>50 periods, more nodes can be ignored by ignoring nodes whose amplitude A<max A*(5*reltol). This is opposed to the initial criteria of ignoring nodes whose amplitude A<max A*reltol.

Figure 6B:
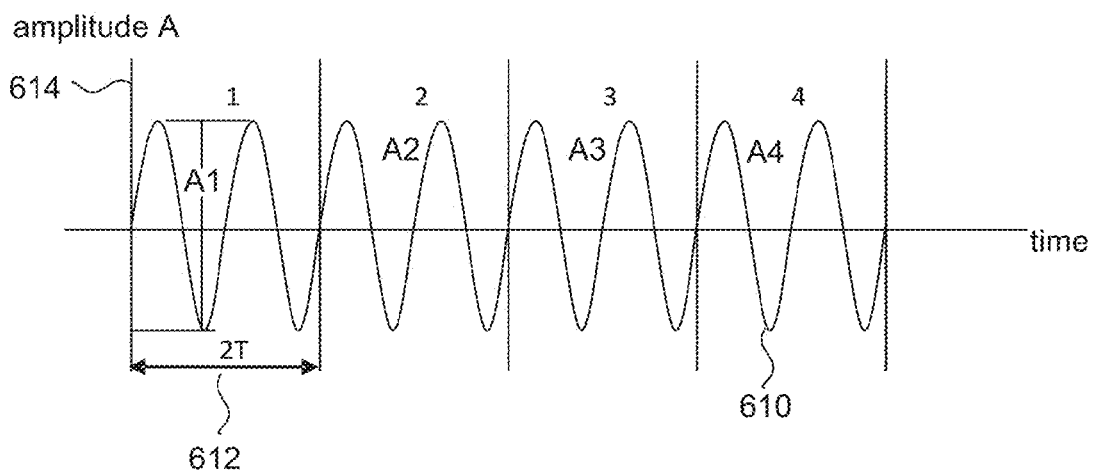

Steady state detection for oscillator circuits is similar to driven circuits except as discussed below. For the oscillator circuit case, at a sub-block 340b, the steady state detector module 204 is configured to calculate an amplitude A for each 2T fundamental periods of the output signal/waveform for a given node of the circuit. An example waveform 610 representative of the circuit output at a given node as a function of time is shown in FIG. 6B. Note that the waveform shown in FIG. 6B is provided for illustration purposes and does not necessarily represent the actual waveform shape of the node output in response to a known periodic input signal. The waveform 610 has a fundamental period T (which is not known but estimated based on a period provided by the circuit designer) and an amplitude A 614. Because an amplitude is determined for each 2T fundamental periods 612 of the waveform 610, the numbers "1," "2," "3," and "4" shown in FIG. 6B are representative of the first, second, third, and fourth 2T periods or sections of the output waveform/signal. In the discussion below, such 2T periods are referred to as "periods" for ease of discussion (e.g., adjacent output signal periods 1, 2, and 3) but it is understood that each "period" is a 2T fundamental period 612.

At the sub-block 340b, three amplitudes of waveform 610—A1, A2, and A3—are calculated or determined for each of adjacent three output signal periods 1, 2, and 3, respectively, of a given circuit node. The adjacent output signal periods may be referred to as x/y/z for shorthand, such as 1/2/3. This calculation or determination is repeated for each of the remaining nodes of the circuit under consideration. Thus, a set of three amplitudes is calculated or determined for each node of the circuit. Each of amplitudes A1, A2, and A3 may comprise an average amplitude value within its 2T time period.

Next at a sub-block 342b, the steady state module 204 prepares the three amplitudes for each node to compare against the steady state criteria. In one embodiment, the maximum amplitude (max A) among all amplitudes across all nodes (for 1/2/3 periods) is identified, and if that max A>1, then reset max A=1. Also, for all nodes (for 1/2/3 periods), determine if any amplitude A<max A*reltol, where reltol is a pre-defined constant comprising a very small number.

Then at a sub-block 344b, the steady state module 204 compares the three amplitudes for a given node against the steady state criteria as follows. This is repeated for each node of the circuit, except those node(s) having an amplitude A<max A*reltol (as determined in sub-block 342b). The steady state criteria for a given node (for 1/2/3 periods) is as follows:

$$abs(d1/mean)<factor, abs(d2/mean)<factor, abs(d3/mean)<factor, \text{ and } d1*d3<=0; \text{ or} \quad (Eq. 2)$$

$$d1*d3>0 \text{ and } abs(d2/mean)<factor/2; \quad (Eq. 3)$$

where factor=0.01,
d1=A1−A2,
d2=A1−A3,
d3=A2−A3, and
mean=(A1+A2+A3)/3.

In Eq. 2, satisfaction of criterion d1*d3<=0 indicates that the amplitude has small fluctuations, e.g., close to stabilizing. Conversely in Eq. 3, criterion d1*d3>0 indicates that the amplitude is increasing or decreasing (e.g., not close to stabilizing) and thus a tighter "factor," that is "factor/2," is used.

If the steady state criteria is satisfied for all nodes for the given adjacent three output signal periods (yes branch of sub-block 346b), then the output of all nodes of the circuit have reached steady state and the flow proceeds to block 310. Nodes that are ignored due to their small amplitudes (amplitude<max A*reltol) are deemed to have reached steady state. Otherwise at least one node has not satisfied the steady state criteria (no branch of sub-block 346b), and a check is performed to see whether the input signal period corresponding to at least one of the given adjacent three output signal periods is the same as the highest applied input period in the transient simulation (sub-block 348b). For example, if transient simulation has been performed for up to the 50th input signal period (at block 302 of FIG. 3) and at least one of the current adjacent three output signal periods corresponds to the 50th input signal period, then there are no more output signal portions to analyze for steady state. If the end or highest applied input period has been reached (yes branch of sub-block 348a), then the flow proceeds to block 306.

Otherwise there are more output signal portions to analyze (no branch of sub-block 348b), and the steady state detector module 204 advances the given adjacent three output signal periods by one period, at a sub-block 350b, and returns to sub-block 340b to analyze the next set of three amplitudes for each node. As an example, if the immediately previous periods are 1/2/3, then the next adjacent three output signal periods are 2/3/4, and then the adjacent three output signal periods after that are 3/4/5, etc.

For Eqs. 2 and 3 of sub-block 344b, if steady state still has not occurred at all nodes as the time/output period number is increasing, the steady state criteria is loosened. In one embodiment, for output signal period>20 periods, pre-defined constant "factor" is loosened from 0.01 to 0.03. This means that steady state is deemed to be reached when a difference of less than 3% occurs (as opposed to the tighter criteria of less than 1%). Moreover, once the output signal period>50 periods, more nodes can be ignored by ignoring nodes whose amplitude A<max A*(5*reltol). This is opposed to the initial criteria of ignoring nodes whose amplitude A<max A*reltol.

Figure 7:
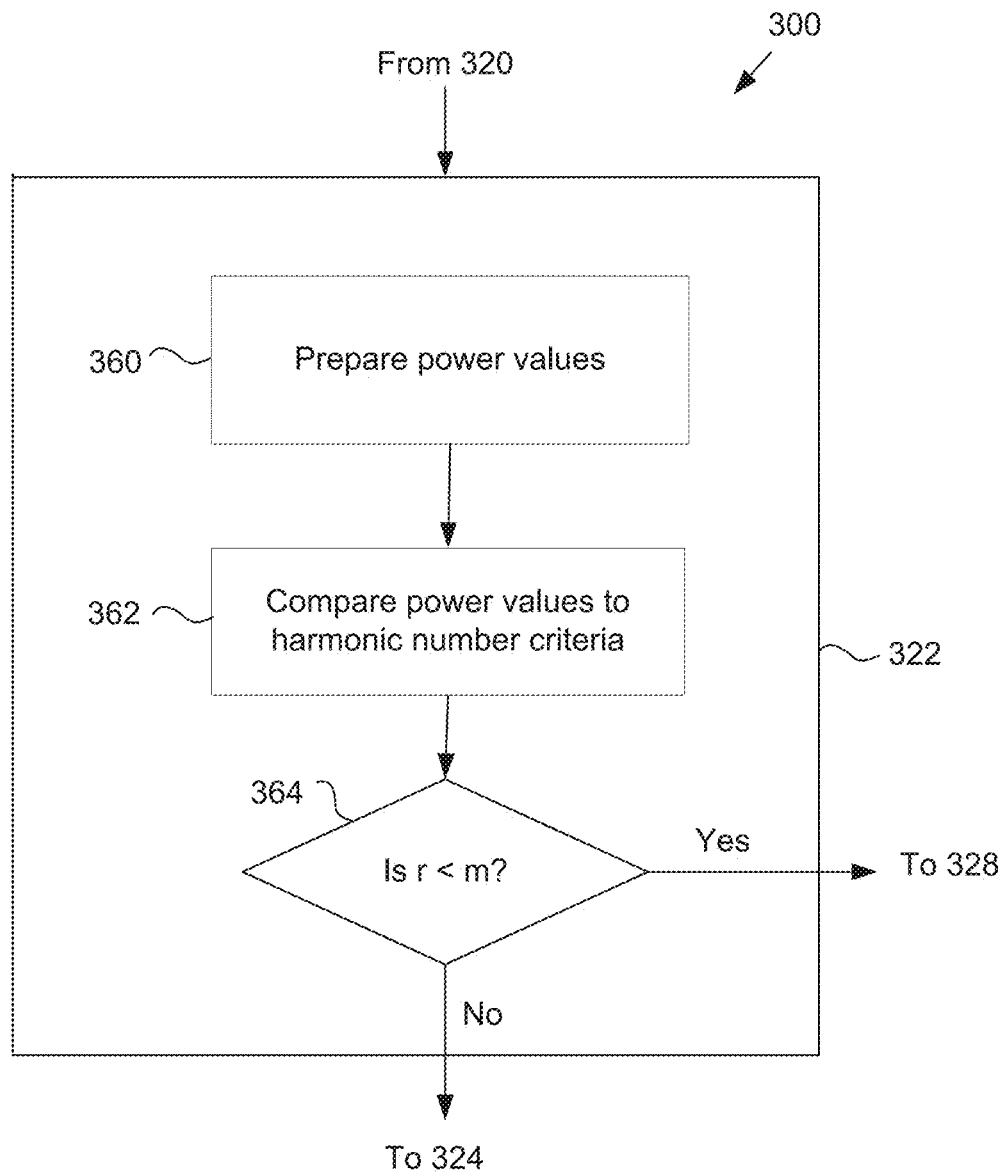
FIG. 7 illustrates example sub-blocks of FIG. 3 providing details of optimal harmonic number detection according to some embodiments.

FIG. 7 illustrates example sub-blocks of block 322 of FIG. 3 providing details of optimal harmonic number detection or identification according to some embodiments. Based on Parseval's theorem for periodical signals, the optimal harmonic number for a circuit under consideration is at which its frequency domain power is close to its time domain power. At a sub-block 360, the power calculation module 208 is configured to prepare the power values to compare against the harmonic number criteria. Preparation of the power values comprise using the time domain total power $P_t$ of the output corresponding to the next/extra input period for each of the nodes (block 314), the (summed) frequency domain total power $P_f$ of the output corresponding to the next/extra input period for the 0th to ith harmonic for each of the nodes (block 320), a direct current (DC) power $P_{dc}$ of the output corresponding to the next/extra input period for each of the nodes. The DC power $P_{dc}$ comprises the 0th harmonic power value for each of the nodes. Preparation also includes identifying a maximum power (maxPower) of $P_t - P_{dc}$ from among all of the nodes. And if maxPower>1, reset maxPower=1. In one embodiment, the output at each node corresponding to the next/extra input period has at least 200 time points.

Next at a sub-block 362, the power calculation module 208 is configured to apply the prepared power values to the following harmonic number criteria for each of the nodes. As a preliminary matter, nodes satisfying the following condition are ignored. Ignored nodes are deemed to be nodes whose optimal harmonic number has been detected.

Ignore nodes whose $P_t<$1e-14 or $P_{dc}/P_t>$0.999.

$$r1=(P_t-P_{dc})/\text{maxPower} \quad (Eq. 4)$$

$$r=P_f/P_t \quad (Eq. 5)$$

where if r1<1e-12, then ignore this node;
if r1<1e-10 and harmonic number i>20, ignore this node;
if r1<1e-8 and harmonic number i>50, ignore this node;
if r1<1e-6 and harmonic number i>100, ignore this node; or
if r<0.2 and harmonic number i>(10*divideRatio), ignore this node,
where divideRatio=1 when the circuit has no frequency divider, and divideRatio>1 when the circuit has a frequency divider, wherein a frequency divider is a circuit (portion) whose output signal frequency is a fraction of its input signal frequency (e.g., if the input signal frequency is 100 KHz and output signal frequency is 50 KHz, the divideRatio=2).

Ignore nodes whose $P_f$ for later harmonic numbers (i$P_f$) increases very little relative to $P_f$ for earlier harmonic numbers. In particular, if i$P_f<(P_f*$1e-5), r>0.93, and $(P_t-P_{dc})<$5e-6, then ignore this node.

In general, nodes that can be ignored comprise nodes having a very small $P_t$ or $(P_t-P_{dc})$ below a pre-defined value.

Once nodes that can be ignored are identified, for each of the remaining nodes, apply the following harmonic number criteria:

$$r<m, \quad (Eq. 6)$$

where m=0.9+0.1*tan h(log 10(r1)/5+1.7).

If r<m for at least one of the nodes (yes branch of sub-block 364), then the current harmonic number i is not large enough and the flow proceeds to block 328. Otherwise if r>=m for all of the remaining nodes (no branch of sub-block 364), then the optimal harmonic number is found (proceed to block 324).

Note that automatic determination of the optimal harmonic number is applicable for one-tone and multi-tone circuits. In some embodiments, for multi-tone circuits, the automatic determination is applicable for the first tone of the multi-tones of the circuit. Moreover, in order to avoid simulator exhaustion of computer memory, the maximum (optimal) harmonic number may depend upon circuit size, e.g., the number of nodes of the circuit. As circuit size increases, the maximum (optimal) harmonic number decreases.

Figure 8:
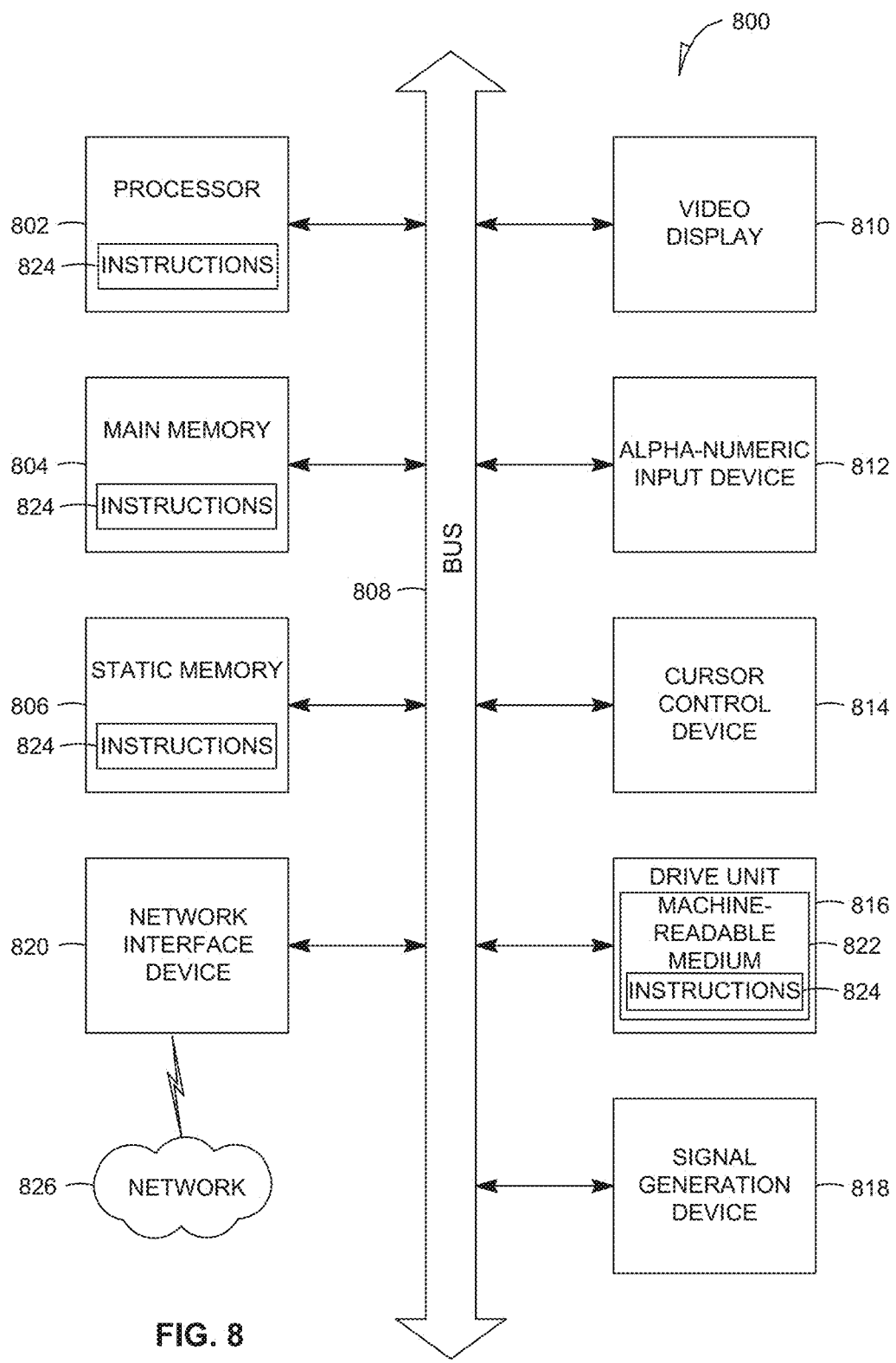
FIG. 8 illustrates a diagrammatic representation of a machine within which a set of instructions, for causing the machine to perform any one or more of the methodologies discussed herein, may be executed according to some embodiments.

FIG. 8 shows a diagrammatic representation of a machine in the example form of a computer system 800 within which a set of instructions, for causing the machine to perform any one or more of the methodologies discussed herein, may be executed. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a server computer, a client computer, a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 800 includes a processor 802 (e.g., a central processing unit (CPU), a graphics processing unit (GPU), or both), a main memory 804 and a static memory 806, which communicate with each other via a bus 808. The computer system 800 may further include a video display unit 810 (e.g., organic light emitting diode (OLED) display, liquid crystal display (LCD), or a cathode ray tube (CRT)). The computer system 800 also includes an alphanumeric input device 812 (e.g., a physical or virtual keyboard), a cursor control device 814 (e.g., a mouse), a disk drive unit 816, a signal generation device 818 (e.g., a speaker) and a network interface device 820.

The disk drive unit 816 includes a machine-readable medium 822 on which is stored one or more sets of instructions (e.g., software 824) embodying any one or more of the methodologies or functions described herein. The software 824 may also reside, completely or at least partially, within the main memory 804 and/or within the processor 802 during execution thereof by the computer system 800, the main memory 804 and the processor 802 also constituting machine-readable media.

The software 824 may further be transmitted or received over a network 826 via the network interface device 820.

While the machine-readable medium 822 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present invention. The term "machine-readable medium" shall accordingly be taken to include, but not be limited to, solid-state memories, optical and magnetic media, and carrier wave signals.

It will be appreciated that, for clarity purposes, the above description describes some embodiments with reference to different functional units or processors. However, it will be apparent that any suitable distribution of functionality between different functional units, processors or domains may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Certain embodiments described herein may be implemented as logic or a number of modules, engines, components, or mechanisms. A module, engine, logic, component, or mechanism (collectively referred to as a "module") may be a tangible unit capable of performing certain operations and configured or arranged in a certain manner. In certain example embodiments, one or more computer systems (e.g., a standalone, client, or server computer system) or one or more components of a computer system (e.g., a processor or a group of processors) may be configured by software (e.g., an application or application portion) or firmware (note that software and firmware can generally be used interchangeably herein as is known by a skilled artisan) as a module that operates to perform certain operations described herein.

In various embodiments, a module may be implemented mechanically or electronically. For example, a module may comprise dedicated circuitry or logic that is permanently configured (e.g., within a special-purpose processor, application specific integrated circuit (ASIC), or array) to perform certain operations. A module may also comprise programmable logic or circuitry (e.g., as encompassed within a general-purpose processor or other programmable processor) that is temporarily configured by software or firmware to perform certain operations. It will be appreciated that a decision to implement a module mechanically, in dedicated and permanently configured circuitry, or in temporarily configured circuitry (e.g., configured by software) may be driven by, for example, cost, time, energy-usage, and package size considerations.

Accordingly, the term "module" should be understood to encompass a tangible entity, be that an entity that is physically constructed, permanently configured (e.g., hardwired), non-transitory, or temporarily configured (e.g., programmed) to operate in a certain manner or to perform certain operations described herein. Considering embodiments in which modules or components are temporarily configured (e.g., programmed), each of the modules or components need not be configured or instantiated at any one instance in time. For example, where the modules or components comprise a general-purpose processor configured using software, the general-purpose processor may be configured as respective different modules at different times. Software may accordingly configure the processor to constitute a particular module at one instance of time and to constitute a different module at a different instance of time.

Modules can provide information to, and receive information from, other modules. Accordingly, the described modules may be regarded as being communicatively coupled. Where multiples of such modules exist contemporaneously, communications may be achieved through signal transmission (e.g., over appropriate circuits and buses) that connect the modules. In embodiments in which multiple modules are configured or instantiated at different times, communications between such modules may be achieved, for example, through the storage and retrieval of information in memory structures to which the multiple modules have access. For example, one module may perform an operation and store the output of that operation in a memory device to which it is communicatively coupled. A further module may then, at a later time, access the memory device to retrieve and process the stored output. Modules may also initiate communications with input or output devices and can operate on a resource (e.g., a collection of information).

Although the present invention has been described in connection with some embodiments, it is not intended to be limited to the specific form set forth herein. One skilled in the art would recognize that various features of the described embodiments may be combined in accordance with the invention. Moreover, it will be appreciated that various modifications and alterations may be made by those skilled in the art without departing from the spirit and scope of the invention.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A method for identifying an optimal harmonic number of a circuit, the method comprising:
   simulating, with a processor, the circuit with a transient simulation of information representative of an integrated circuit design corresponding to the circuit, the transient simulation of the circuit including applying a periodic input waveform up to a particular number of periods and obtaining an output waveform in response, the output waveform modeling instantaneous circuit output values as a function of time;
   upon detecting, by the processor, a steady state response of the output waveform, performing the transient simulation on the circuit for an additional period of the periodic input waveform beyond the particular number of periods, and obtaining a further output waveform corresponding to the additional period of the periodic input waveform;
   calculating, by the processor, at least a time domain power value and a frequency domain power value using the further output waveform corresponding to the additional period of the periodic input waveform; and
   detecting, by the processor, a harmonic of the further output waveform corresponding to the additional period of the periodic input waveform at which the time domain power value and the frequency domain power value converge with each other.

2. The method of claim 1, further comprising performing harmonic balance analysis of the circuit using the information representative of the integrated circuit design corresponding to the circuit and the detected harmonic, the detected harmonic comprising a number of harmonics of the further output waveform to simulate during the harmonic balance analysis.

3. The method of claim 1, wherein the detection of the steady state response of the output waveform comprises detecting the steady state response for each node of the circuit.

4. The method of claim 1, wherein the detection of the harmonic comprises detecting the time domain power value and the frequency domain power value convergence for each node respectively of the circuit except for the nodes having the time domain power value below a pre-defined value.

5. The method of claim 1, wherein the calculation of the time domain power value comprises an integral of the further output waveform corresponding to the additional period of the periodic input waveform, and the calculation of the frequency domain power value comprises a Fourier transform of the further output waveform corresponding to the additional period of the periodic input waveform for a 0th to ith harmonic of the further output waveform, the ith harmonic being the detected harmonic.

6. The method of claim 1, wherein the detecting of the steady state response comprises detecting a difference among three amplitudes of the output waveform for three adjacent periods of the output waveform of less than a pre-defined value.

7. The method of claim 1, wherein the circuit comprises at least one of a microwave circuit, a radio frequency (RF) circuit, a driven-type of circuit having a known fundamental period, and an oscillator-type of circuit having an unknown fundamental period.

8. The method of claim 7, wherein the circuit comprises the driven-type of circuit and wherein the detecting of the steady state response comprises detecting using three amplitudes of the output waveform corresponding to three adjacent periods of the output waveform, each of the three amplitudes corresponding to respective one of the known fundamental period of the output waveform.

9. The method of claim 7, wherein the circuit comprises the oscillator-type of circuit and wherein the detecting of the steady state response comprises detecting using three amplitudes of the output waveform corresponding to three adjacent portions of the output waveform, each of the three amplitudes corresponding to respective estimated two of the unknown fundamental periods of the output waveform.

10. The method of claim 1, wherein the detecting of the steady state response comprises detecting when the output waveform transitions from a transient response to the steady state response.

11. A system, comprising:
   a storage device encoded with information representative of an integrated circuit design corresponding to a circuit and at least one periodic input waveform; and
   a computing device in communication with the storage device, wherein the computing device is configured to:
   simulate the circuit with a transient simulation of the information representative of the integrated circuit design, wherein the transient simulation of the circuit includes applying a periodic input waveform up to a particular number of periods and obtaining an output waveform in response, the output waveform modeling instantaneous circuit output values as a function of time;
   upon detection of a steady state response of the output waveform, perform the transient simulation on the circuit for an additional period of the periodic input waveform beyond the particular number of periods, and obtaining a further output waveform corresponding to the additional period of the periodic input waveform; and automatically identify a harmonic of the further output waveform, for use in conducting harmonic balance analysis of the integrated circuit design, using at least a time domain power value and a frequency domain power value calculated based on the further output waveform corresponding to the additional period of the periodic input waveform.

12. The system of claim 11, wherein up to 50 periods of the periodic input waveform is applied incrementally.

13. The system of claim 11, wherein the integrated circuit design comprises at least one of a microwave circuit, a radio frequency (RF) circuit, a driven-type of circuit having a known fundamental period, and an oscillator-type of circuit having an unknown fundamental period.

14. The system of claim 11, wherein the detection of the output waveform switching from the transient response to the steady state response comprises detection of a difference among three amplitudes of the output waveform corresponding to three adjacent periods of the output waveform of less than a pre-defined value.

15. The system of claim 14, wherein the pre-defined value is 1%.

16. The system of claim 14, wherein the pre-defined value is 3% when any of the three adjacent periods of the output waveform is greater than the 20th period.

17. The system of claim 11, wherein the automatic identification of the harmonic comprises detection of approximately same values for each of the time domain power value and the frequency domain power value.

18. The system of claim 11, wherein the detection of the output waveform transitioning from the transient response to the steady state response comprises detection of the steady state response for each node of the integrated circuit design.

19. The system of claim 11, wherein the automatic identification of the harmonic comprises detection of convergence of the time domain power value and the frequency domain power value for each node respectively of the integrated circuit design except for the nodes having the time domain power value below a pre-defined value.

20. The system of claim 11, wherein the time domain power value comprises an integral of the further output waveform corresponding to the additional period of the periodic input waveform, and the frequency domain power value comprises a Fourier transform of the further output waveform corresponding to the additional period of the periodic input waveform for a 0th to ith harmonic of the output waveform, the ith harmonic being the automatically identified harmonic.

21. The system of claim 11, wherein, in response to not detecting the output waveform transitioning from the transient response to the steady state response, incrementally apply a pre-determined next set of periods of the periodic input waveform to the integrated circuit design to obtain an additional output waveform corresponding to each period of the pre-determined next set of periods of the periodic input waveform.

22. A non-transitory computer readable medium including instructions, that when executed by a processor, cause the processor to perform operations comprising:

simulating a circuit with a transient simulation of information representative of an integrated circuit design corresponding to the circuit, the transient simulation of the circuit including applying a periodic input waveform up to a particular number of periods and obtaining an output waveform in response, the output waveform modeling instantaneous circuit output values as a function of time;

upon detecting a steady state response of the output waveform, performing the transient simulation on the circuit for an additional period of the periodic input waveform beyond the particular number of periods, and obtaining a further output waveform corresponding to the additional period of the periodic input waveform;

calculating by the processor, at least a time domain power value and a frequency domain power value using the further output waveform corresponding to the additional period of the periodic input waveform; and detecting a harmonic of the further output waveform corresponding to the additional period of the periodic input waveform at which the time domain power value and the frequency domain power value converge with each other.

23. The non-transitory computer readable medium of claim 22, further comprising performing harmonic balance analysis of the circuit using the information representative of the integrated circuit design corresponding to the circuit and the detected harmonic, the detected harmonic comprising a number of harmonics of the output waveform to simulate during the harmonic balance analysis.

24. The non-transitory computer readable medium of claim 22, wherein the detection of the steady state response of the output waveform comprises detecting the steady state response for each node of the circuit.

25. The non-transitory computer readable medium of claim 22, wherein the detection of the harmonic comprises detecting the time domain power value and the frequency domain power value convergence for each node respectively of the circuit except for the nodes having the time domain power value below a pre-defined value.

26. The non-transitory computer readable medium of claim 22, wherein the calculation of the time domain power value comprises an integral of the further output waveform corresponding to the additional period of the periodic input waveform, and the calculation of the frequency domain power value comprises a Fourier transform of the further output waveform corresponding to the additional period of the periodic input waveform for a 0th to ith harmonic of the output waveform, the ith harmonic being the detected harmonic.

27. The non-transitory computer readable medium of claim 22, wherein the circuit comprises at least one of a microwave circuit, a radio frequency (RF) circuit, a driven-type of circuit having a known fundamental period, and an oscillator-type of circuit having an unknown fundamental period.

* * * * *